(12) United States Patent
Zafarana

(10) Patent No.: US 7,411,428 B2
(45) Date of Patent: Aug. 12, 2008

(54) MULTISENSE-ADAPTIVE READING CIRCUIT, PARTICULARLY FOR INTERLEAVED DC-DC CONVERTERS AND CORRESPONDING READING METHOD

(75) Inventor: Alessandro Zafarana, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 667 days.

(21) Appl. No.: 10/897,326

(22) Filed: Jul. 22, 2004

(65) Prior Publication Data
US 2005/0040865 A1  Feb. 24, 2005

(30) Foreign Application Priority Data
Jul. 22, 2003 (IT) ............ MI2003A1505

(51) Int. Cl.
*H03K 5/153* (2006.01)
(52) U.S. Cl. .................. 327/78; 327/112
(58) Field of Classification Search .......... 327/78, 327/80, 88, 89, 108–112
See application file for complete search history.

(56) References Cited

U.S. PATENT DOCUMENTS

| | | | | |
|---|---|---|---|---|
| 4,599,522 A | * | 7/1986 | Matsuo et al. | 327/382 |
| 5,552,695 A | * | 9/1996 | Schwartz | 323/271 |
| 6,172,550 B1 | * | 1/2001 | Gold et al. | 327/366 |
| 6,246,220 B1 | * | 6/2001 | Isham et al. | 323/224 |
| 6,268,716 B1 | * | 7/2001 | Burstein et al. | 323/272 |
| 6,765,372 B2 | * | 7/2004 | Isham | 323/224 |
| 6,954,054 B2 | * | 10/2005 | Brown | 323/283 |
| 7,180,278 B2 | * | 2/2007 | Tai et al. | 323/280 |
| 2004/0196018 A1 | * | 10/2004 | Sutardja et al. | 323/283 |
| 2005/0231177 A1 | * | 10/2005 | Tateno et al. | 323/225 |

* cited by examiner

*Primary Examiner*—N. Drew Richards
*Assistant Examiner*—Thomas J. Hiltunen
(74) *Attorney, Agent, or Firm*—Lisa K. Jorgeonson; Dennis M. de Guzman; Seed IP Law Group PLLC

(57) ABSTRACT

A multisense-adaptive reading circuit is described, which is associated to a sense element of an interleaved DC-DC converter module. The reading circuit comprises at least a first and second current source connected to a first and second terminal of the module, connected in turn to a first and second resistive element, as well as a tracker of a current information coming from the first and second current source. Advantageously according to the invention, the reading circuit also comprises a reading mode detector effective to detect a common mode voltage value and, based on this value, to determine a reading mode being used among possible reading modes to self-adapt the reading circuit to the reading mode being used by providing convenient enabling signals to the first and second current sources and to the tracker. A multisense-self-adaptive reading method being implemented by means of that circuit is also described.

27 Claims, 8 Drawing Sheets

MULTISENSE-ADAPTIVE READING CIRCUIT, PARTICULARLY FOR INTERLEAVED DC-DC CONVERTERS AND CORRESPONDING READING METHOD

BACKGROUND OF THE INVENTION

1. Field of the Invention

The present invention relates to a multisense-adaptive reading circuit and reading method.

More specifically the invention relates to a multisense-adaptive reading circuit, associated to a sense element of an interleaved DC-DC converter module and comprising at least a first and second current source connected to a first and second terminal of said module, connected in turn to a first and second resistive element, as well as a tracker of a current information coming from said first and second current source.

The invention also relates to a multisense-self-adaptive reading method.

The invention relates particularly, but not exclusively, to a reading circuit used by the modules of an interleaved DC-DC converter and the following description is made with reference to this field of application for convenience of illustration only.

2. Description of the Related Art

As it is well known, the continuous development of the electric features of processors or CPUs (acronym for the English Computing Processing Unit) for PCs, workstations and servers force producers to look for ever-new solutions to meet the requirements required by central processing units or CPUs. In particular, latest generation CPUs require a high supply voltage precision, equal for example to +/−0.8% in the steady state and +/−3% in the transient state.

Besides these precision requirements, the supply voltages being used fall to 0.8V and load currents rise to 120 A with edges of 100 A/μs, with an efficiency requirements exceeding 80%.

It is thus a matter of using convenient voltage or current controller devices being capable to ensure the required efficiency. Such a device comprises for example an interleaving DC-DC converter, used as an economic and effective solution to meet said requirements and to obtain an output voltage value starting from an input voltage value Vin being equal to 12V+/−1.2V through an ATX bus or equal to 5V+/−0.5V through an ATX bus.

In particular, such a converter topology is obtained by connecting in parallel N Buck-or-step-down-configured DC converters, i.e., by connecting the input and output terminals together. Each DC-DC converter is called module, channel or phase.

The known DC-DC converter interleaving configuration also implies that a convenient clock circuit closes high-side switches comprised in the N modules with a phase displacement corresponding to the switching period T divided by the number N of modules.

By applying the well known voltage control mode to an interleaving configuration such as the one being described, an uncontrolled distribution of the currents in the inductances of the parallel N modules is obtained. It is instead desirable to obtain a predetermined total load current with an egalitarian distribution between the modules, i.e., to obtain that each module carries a current being equal to the output current required divided by N.

To this purpose it is known to use a so-called "current sharing" technique.

Besides the need to use the current sharing technique, the known interleaving-configured DC-DC converter must be able to vary the output voltage value thereof proportionally to the total current required. In other words, by indicating with VID a nominal output voltage value when the DC-DC converter provides a null current value and being I a required output current value, the output voltage value Vout is given by:

$$Vout = VID - I \times Rdroop$$

where Rdroop is a factor which is programmable outside the DC-DC converter and variable according to the CPUs wherein this DC-DC converter must be used. Thus it is dealt with droop functions or voltage positioning.

Such a DC-DC converter must also control that an anomalous current load does not damage the devices fed thereby. In particular the over current or short circuit conditions into which a load degenerates are conditions which must be traced and remedied by a control system associated to the DC-DC converter protecting the load, i.e., the devices connected to the interleaving DC-DC converter.

All these control and protection functions (i.e., the "voltage positioning", the "current sharing" and the protection against "Over current" and "Short Circuit" conditions) implies an effective reading and processing system of an analogue information corresponding to a current value of each module.

Known reading systems, in order to meet the Current Sharing and droop function requirements, are designed in order to read or evaluate a current value being delivered by each module towards the output terminal thereof. In particular, a known reading system reads this module current value as a voltage drop across a resistance associated to each module. This resistance can be a module parasitic element (such as a turn-on resistance Rds, on of power switches comprised therein or an inductance resistance DCR) or it can be an element being suitably inserted in the circuit (a reading resistance Rsense arranged in series with the power switches or the inductance).

The first solution is more economical since it exploits elements being already comprised in the module topology, but it provides an inaccurate reading since it is sensitive to the component production variations and to the temperature thereof.

The second solution has the advantage to obtain a very precise and temperature-independent reading, for example realising these supplementary elements with constantan, with the drawback of a higher cost and a conversion efficiency reduction.

FIGS. 1A to 1C show different operating conditions of an interleaved DC-DC converter comprising N modules, comprising in turn a HighSide switch and a LowSide switch realised by means of power transistors. It is assumed that at the output a current I is required, which is equally distributed between the N modules.

In particular, each module 10 comprises a transistor MH serving as a HighSide switch being series-connected to a transistor ML serving as a LowSide switch between a first and second voltage reference, particularly an input voltage Vin and a ground GND. This input voltage Vin is particularly applied to an ATX bus.

The module 10 also comprises the series of an inductor L and an output capacitor Cout being inserted between an intermediate node X between the transistors MH and ML and the ground.

An output voltage value Vout of the module 10 is across the capacitor Cout.

The following cases occur:

1) As shown in FIG. 1A, the reading of a current IA of the module 10 occurs between a drain terminal and a source terminal of the transistor MH, i.e., of the HighSide switch of the module 10.

In that case, the reading is few dissipative since the module current IA flows in the transistor MH, which is a power MOS transistor, only for a time equal to DTs (where Ts is the switching period of the switches MH and ML and D is the duty cycle or the time percentage with respect to Ts wherein the transistor is on). Thus it results that the module 10 dissipates a very reduced power especially for a 5V ATX bus.

Moreover, when the switch or transistor MH closes and the source terminal thereof reaches a voltage value being equal to the input voltage Vin, the reading is damaged because of the noise due to the capacitive and inductive coupling effects.

All this makes the reading very difficult.

In practise, the reading across the transistor MH is used with a conversion from Vin to Vout starting from the ATX bus and thus with a sufficiently large time interval DTs wherein the transistor MH is closed.

2) As shown in FIG. 1B, the reading of a current IB of the module 10 occurs between the drain terminal and the source terminal of the transistor ML, i.e., of the LowSide switch of the module 10.

In this case the transistor ML closes for a time equal to (1−D)Ts (where Ts is always the switching time of the switches MH and ML and D is the duty cycle).

There is thus much more time available, the reading can thus be performed for any ATX bus being used. The reading can eventually be performed even with a reading resistance Rsense arranged in series with the transistor ML.

3) As shown in FIG. 1C, the reading of a current IC of the module 10 occurs across the inductor L.

In that case, the reading performed by using an outer reading resistance would be extremely dissipative. A parasitic resistance DCR of the inductor L is thus be used.

Actually, since a terminal of the inductor L oscillates between a ground voltage value GND and the input voltage value Vin, the reading must be acquired by filtering the current value on that parasitic resistance DCR in order to draw a continuous information and an alternate information repeating the original ripple of the current flowing through the inductor L.

In particular, it is possible to use a filter configuration RC comprising the series of a resistor R1 and of a capacitor C1 connected across the inductor L. Moreover, these supplementary elements R1, C1 must be so sized that it results:

$$R1 \times C1 = L/DCR$$

It can thus be perceived that parametric variations of these components cannot ensure that the above-cited condition is always meet, damaging in this case the speed and the performances of the so-obtained module.

It is also possible to cancel this drawback by using a reading resistance Rsense arranged in series with the inductor L, as shown in FIG. 1C. In that case, an 5V or 12V ATX bus can be used as an input voltage value Vin.

Obviously, different reading systems correspond to the above-indicated reading conditions. In particular:

1) By reading the voltage signal across the transistor MH it is possible to draw the load current information only during the transistor conduction. It is thus necessary to avoid reading both during the conduction period of the transistor ML and during the conduction of the schottky diode (or of the intrinsic diode of the synchronous MOS transistor) or during the dead time. In order to minimise the noise in reading it is also worth avoiding the turn-on and turn-off instants of the transistor MH whereon the reading is performed and the turn-on and turn-off instants of the power switches of the remaining phases.

It is thus necessary to insert a tracking system of the collected information.

This system is few dissipative, but of very difficult application in the converters being concerned for power supply CPU applications. In fact in these applications the conduction of the transistor MH occurs for a very short time interval given by Vout/Vin×Ts, where Ts is the switching period.

Since the reading system has a lowest latency time being required to acquire the information and to track it, this constrains the application to a lowest switching period.

2) By reading the voltage signal across the transistor ML it is possible to draw the load current information only during the transistor ML conduction, as seen with reference to the reading on the transistor MH. Also in that case it is necessary to track the analogue information represented by the voltage across the sense element Rsense in an instant far from the switchings of the other components; in the remaining time hold the last value acquired from the information, as described in the Italian patent application No. MI2000A002042 filed on Sep. 19, 2000 in the name of the Applicant itself.

3) By reading the voltage signal across the inductor L (i.e., across the filtering capacity C1) on the contrary the information being obtained is always valid and thus it does not require any tracking. It is perceived therefrom that for the noise-freedom the best reading system is composed by a reading resistance arranged in series with the inductor. Unfortunately this system is the most dissipative of all.

The information acquired by the reading system must be used to perform simultaneously four different functions:

Average Current Mode: it allows the output voltage Vout to be regulated ensuring a fast response to load variations. It also allows a correct current sharing between the modules 10 during the transients to be obtained.

Droop function: The current information is used to shift the reference of a feedback loop proportionally to the load.

Average current sharing: By comparing the so-obtained current of each module with the average current value a control signal of a voltage loop of each module is corrected in order to correct the unbalances between the different modules and equalise the current thereof.

Current limit: In order to obtain a precise and fast current limit an instantaneous, and thus not filtered, information on the current is required. In order to limit the highest current deliverable by the module it is necessary to adapt the limiting mechanism to the reading type.

In particular, when reading on the transistor MH and on the inductor L it is sufficient to turn the transistor MH off whenever the detected current thereof exceeds a set threshold. When reading on the transistor ML, which is already in the falling phase of the inductor L current, the mechanism is more complex, as described in the above-cited patent application.

The technical problem underlying the present invention is to provide a reading circuit for interleaved DC-DC converters, having such structural and functional features as to automatically adapt to a component being used as a reading or "sense" resistance, giving the user the greatest latitude to decide how to optimise the controller design and thus overcoming the limits and drawbacks still affecting the reading circuit realised according to the prior art.

BRIEF SUMMARY OF THE INVENTION

The solution underlying the present invention is to use a circuit for detecting the voltage drop at the converter terminals and, based thereon, to determine the reading mode being used, among the possible LowSide, HighSide or inductance readings.

Based on that solution, one embodiment of the invention includes a multisense-adaptive reading circuit, associated to a sense module.

At least a first and second current source are coupled to a first and second terminal of said module. A first and second resistive element are also coupled to the module, as well as a tracker of a current information coming from said first and second current source. A reading mode detector effective to detect a common mode voltage value and, based on that value, to determine a reading mode being used among possible reading modes to self-adapt said reading circuit to said reading mode being used by providing convenient enabling signals to said first and second current sources and to said tracker.

The problem is also solved by a multisense-self-adaptive reading method of a current value flowing in a sense element, the method comprising the following steps:
  a detection step of a first value of a common mode voltage;
  a first step of comparing said first value with a first threshold value and:
    a. if said first value is higher than said first threshold value, a first reading mode is selected; and
    b. if said first value is lower than said first threshold value, a second reading mode is selected.

The features and advantages of the reading circuit and method according to the invention will be apparent from the following description of an embodiment thereof given by way of non limiting example with reference to the attached drawings.

DETAILED DESCRIPTION OF THE INVENTION

Figure 2:
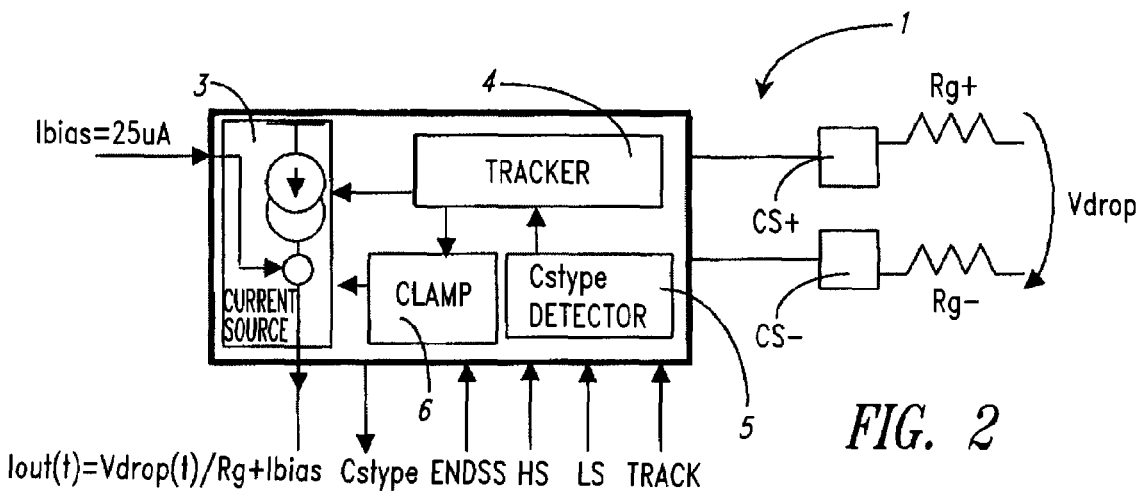
FIG. 2 schematically shows a reading circuit realised according to the invention.

With reference to the figures, and particularly to FIG. 2, a reading circuit realised according to the invention is globally and schematically indicated with 1.

This reading circuit 1 can be used in association to an interleaved DC-DC converter, as seen with reference to the prior art, and particularly to a sense element being used in the modules composing this converter.

Advantageously according to the invention, the reading circuit 1 turns a voltage signal detected by the sense element of each module into a current signal.

As it will be clearly seen in the following description, the reading circuit 1 provides an output signal automatically self-adapting to the selected reading system. In particular, the reading circuit 1 according to the invention automatically adapts a tracking of the voltage signal according to the reading mode to be performed, i.e., if the sense element is associated to the HighSide transistor MH, to the LowSide transistor ML or to the inductance L of the module.

Advantageously according to the invention, the reading circuit 1 allows a signal being free from the noise produced by the remaining power switches comprised in the DC-DC converter to be obtained.

Moreover, in an automatic manner, the reading circuit according to the invention adapts the current limit mechanism to the reading method, ensuring the precision, speed and reliability of the so-obtained information.

Figure 1A:
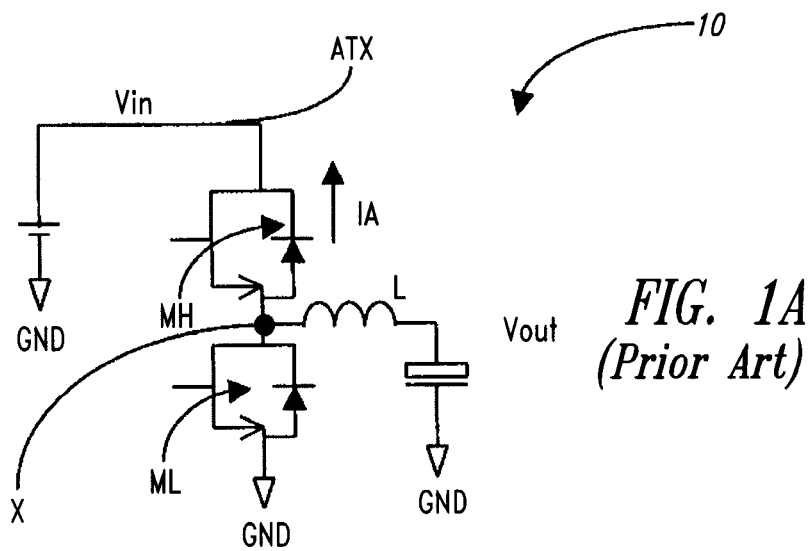
FIGS. 1A to 1C schematically show an interleaved DC-DC converter in different operating conditions.
Figure 1B:
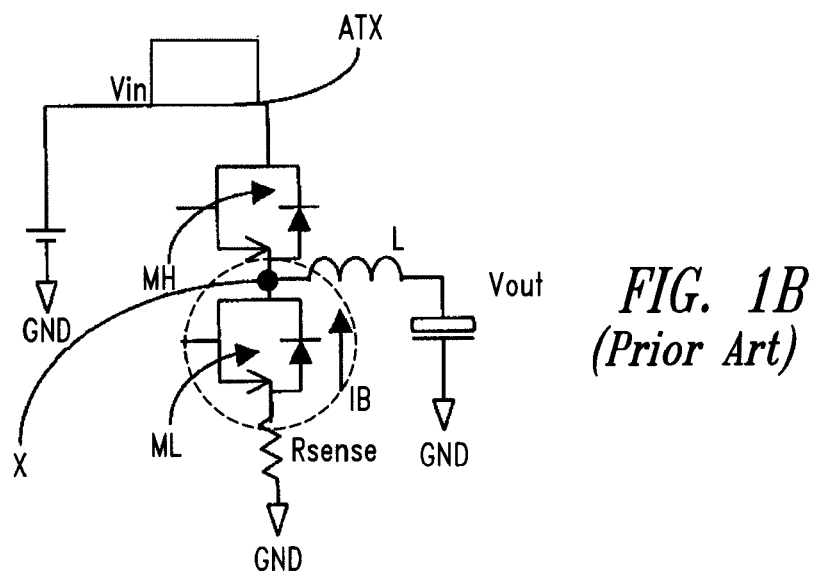
Figure 1C:
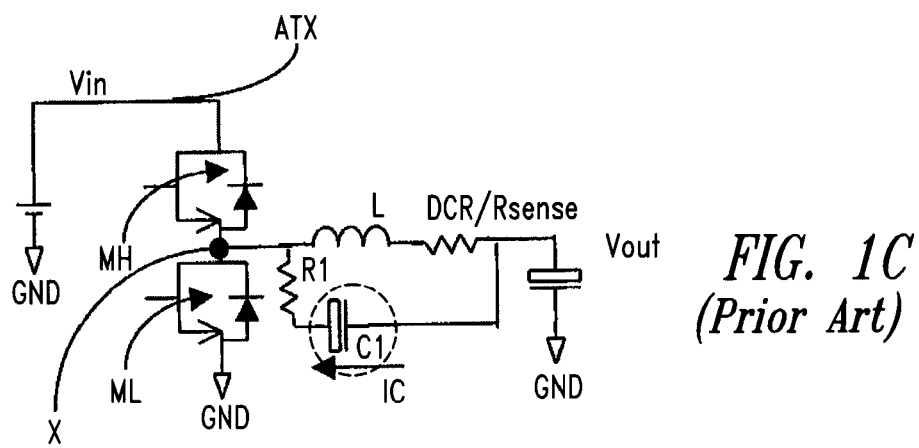

The reading circuit 1 being schematised in FIG. 1 comprises a current source 3 providing an output current Iout.

In particular, the current source 3 receives a bias current Ibias, such as for example a reference current within the device associated to the reading circuit 1, in a preferred embodiment being equal to 25 uA+/−5%.

Moreover, the reading circuit 1 comprises a tracker 4 being input-connected to a reading mode detector 5 and output-connected to a clamping circuit 6 and to the current source 3.

The reading circuit 1 is output-connected to a first CS+ and second terminal CS−, connected in turn to respective serial resistive elements, Rg+, Rg− respectively, across which a voltage drop Vdrop occurs.

Finally, the reading circuit 1 receives at the input the following signals:
  ENDSS: SoftStart end command
  HS: turn-on command of the HighSide transistor MH
  LS: turn-on command of the LowSide transistor ML
  TRACK: digital tracking signal and it outputs an indication of the reading mode being used among the reading modes of sense elements associated to the LowSide transistor, to the HighSide transistor or to the inductance, represented for simplicity by a signal CStype.

As it will be better seen hereafter, the output current Iout from the input stage 2 has a trend in time corresponding to:

$$I\text{out}(t) = V\text{drop}(t)/Rg + I\text{bias} \quad (1)$$

being:

Rg the value of the resistive elements Rg+, Rg− connected to the terminals CS+ e CS− of the reading circuit 1; and Vdrop(t) the trend in time of the voltage drop across the resistive elements Rg+, Rg−, corresponding to $$V\text{drop}(t) = R\text{sense} * i(t),$$

where t is the time and Rsense is the sense component resistance value.

Advantageously, the detector 5 detects the voltage drop at the terminal CS and, based thereon, it provides the indication CStype of the reading mode being used.

Moreover, the resistance value Rg is determined by a final device user in order to set a highest current for the current limit operation. In the example being considered, the current source 3 comprises a current limit comparator with a threshold innerly set to 35 uA.

If Imax is the highest current value of a module, it results that the highest voltage drop value Vdropmax on the module sense element is given by:

$$Vdropmax = Rsense \times Imax$$

and thus:

$$Rg = Vdropmax/35\,uA = Rsense \times Imax/35\,uA$$

Figures 3A, 3B:
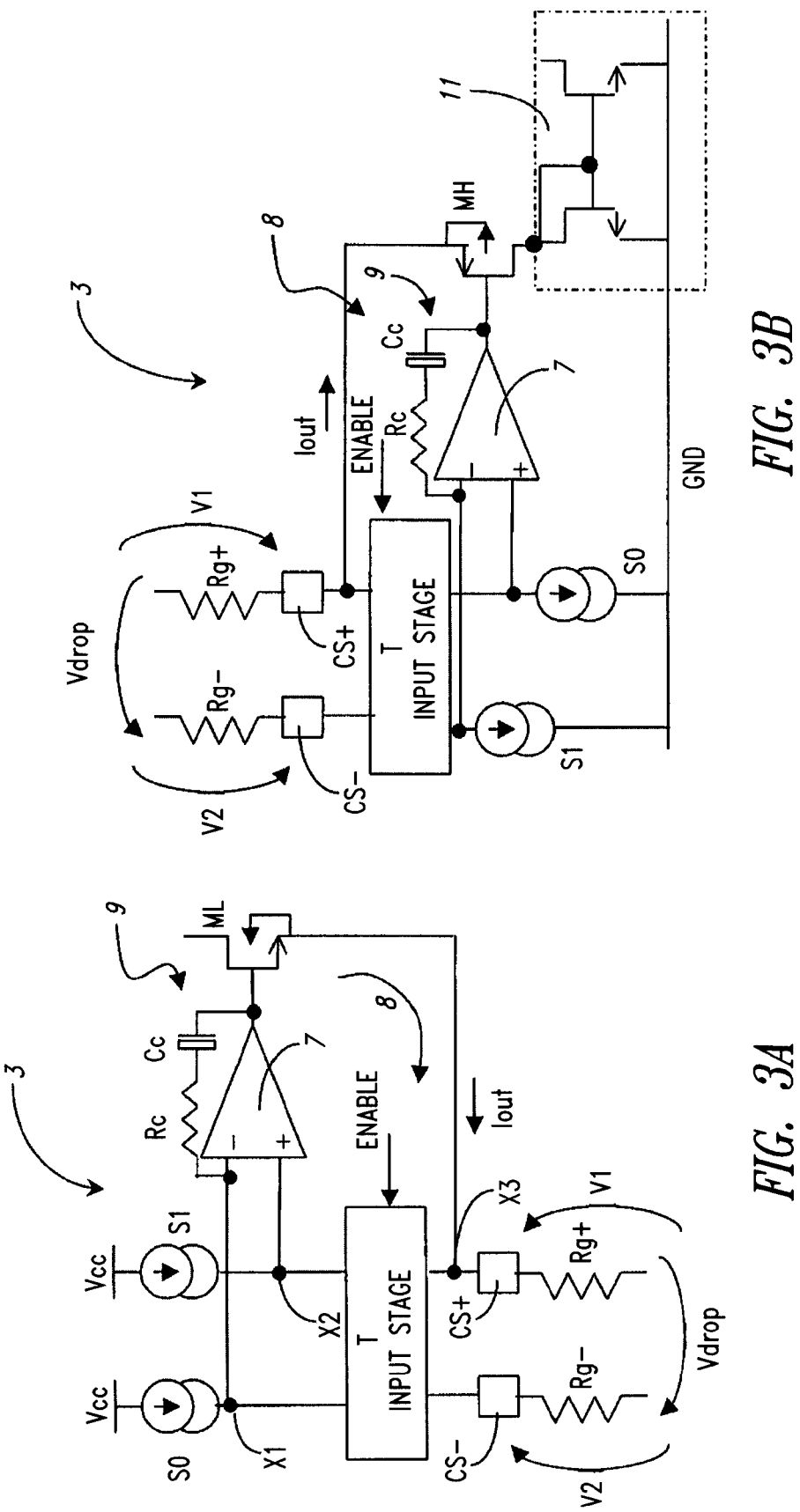
FIGS. 3A and 3B schematically show possible embodiments of a current source being comprised in the reading circuit of FIG. 2.

Advantageously, the current source 3 includes a differential input stage T connected to the terminals CS+ e CS−, as well as to a supply voltage reference Vcc by means of a first S0 and second current generator S1, as shown in FIGS. 3A e 3B.

In particular, the differential input stage T is connected to the first and second current generators S0 e S1 in correspondence with a first X1 and second circuit node X2, connected in turn to a gain A differential stage 7 respectively in correspondence with the inverting and non-inverting input terminals thereof.

The differential stage 7 is thus output-connected to a control terminal of a bypass component, particularly a MOS transistor M1, connected in turn to an intermediate circuit node X3 between the differential input stage T and the terminal CS+.

By using a first generator S0 of 50 uA and a second generator S1 of 25 uA, it results that the voltage values across the resistive elements Rg+, Rg− connected to the terminals CS+, CS− are given by:

$$V1 = Vdrop + 50\,uA * Rg$$

$$V2 = 50\,uA * Rg$$

being Vdrop the voltage drop applied to the free terminals of the resistive elements Rg+ ed Rg−, as well as an output current value Iout, flowing through the bypass component M1, corresponding to:

$$Iout = Vdrop/Rg + 25\,uA$$

It is worth noting that the differential input stage T, the differential stage 7 and the bypass component M1 form a negative feedback loop 8 forcing the terminal CS+ to reach the same voltage set on the terminal CS−.

The so-obtained feedback loop 8 is however unstable. Advantageously according to the invention, in an alternative embodiment, the current source 3 thus comprises a compensation network 9 comprising in turn the series of a resistive element Rc and of a capacitor Cc connected between the output terminal and the inverting input terminal of the differential stage 7.

In fact it can be immediately noticed that the feedback loop 8 inserts a prevalent pole on the non-inverting input terminal of the differential stage 7, because of the high impedance in this terminal. There is also a second pole on the terminal CS+, although the impedance of the bypass component M1 is relatively low.

The compensation network 9 thus inserts a zero whose time constant, given by the product Rc×Cc, stabilises the feedback loop 8.

The current source 3 represented in FIG. 3A can be used in particular when reading a sense element relating to the LowSide transistor ML. It is immediately possible to configure in a dual way this current source 3 in order to perform the reading for the HighSide transistor MH, obtaining the current source 3 schematically represented in FIG. 3B.

In particular, the current source 3 comprises a differential input stage T connected, by means of the generators S0 and S1, to a ground reference GND.

In this case, the current source 3 also comprises a current mirror stage 11 connected between the bypass component M1 and the ground reference GND.

The precision of the signal outputted from the current source depends on the differential input stage T. In particular, for the voltage on the terminal CS+ to be identical to the voltage on the terminal CS− it is desired that the differential input stage T has a negligible voltage error with respect to a lowest value of the signal Vdrop applied to the resistive elements Rg+ed Rg−.

Advantageously according to the invention, the differential input stage T can be realised in the MOS technology or in the bipolar technology.

Figure 4B:
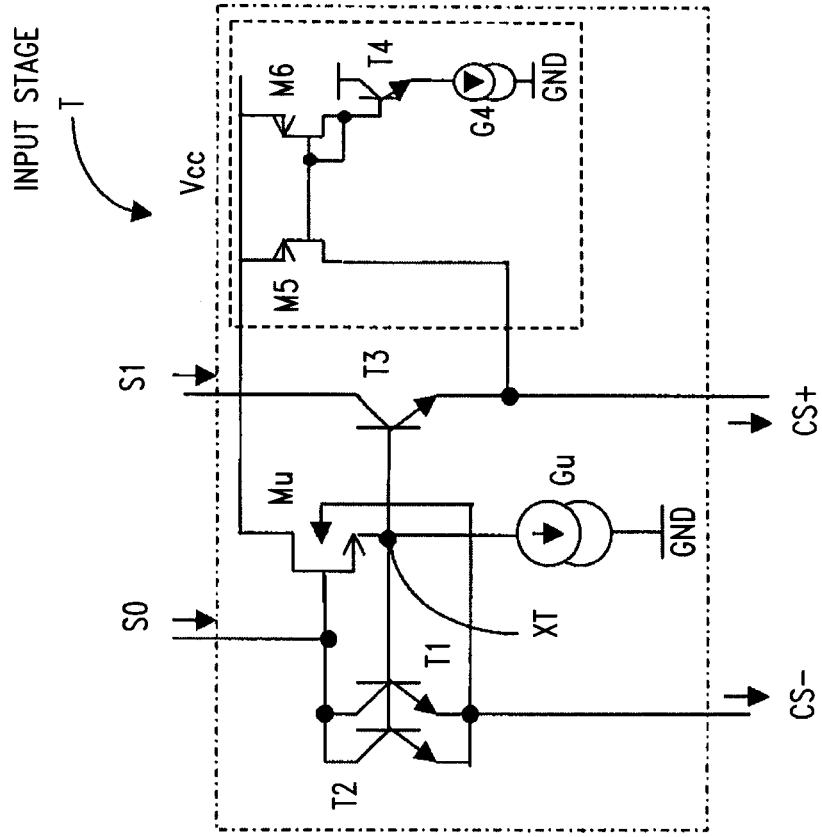
FIGS. 4A and 4B schematically show possible embodiments of a differential input stage being comprised in the current source of FIGS. 3A e 3B.
Figure 4A:
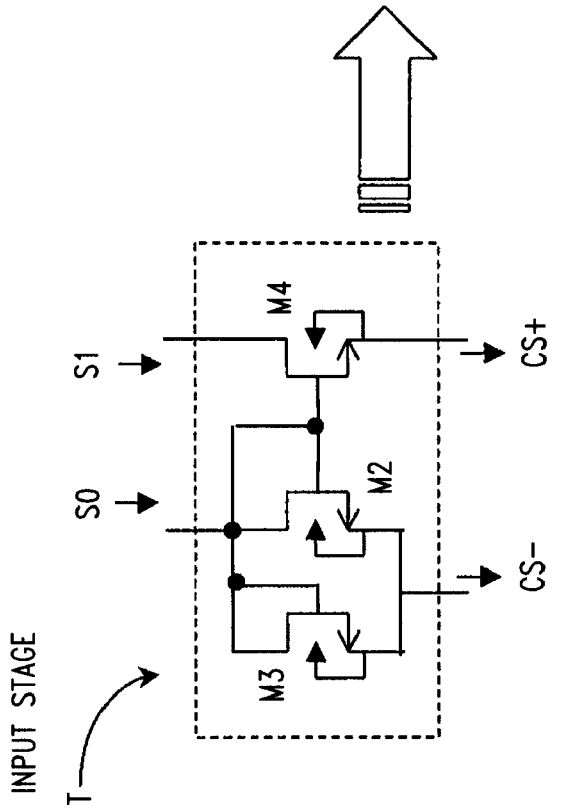

In particular, the MOS embodiment of the differential input stage T, schematically shown in FIG. 4A, is simpler.

Referring to this figure, the differential input stage T comprises a first M2 and second MOS transistor M3, inserted in parallel to each other between the first generator S0 and the terminal CS−. In particular, transistors M2 and M3 have drain and gate terminals connected to each other and to the first generator S0 and source terminals connected to each other and to the terminal CS−. Moreover, the differential input stage T in the MOS embodiment thereof comprises a further third MOS transistor M4 having the conduction terminals connected between the second generator S1 and the terminal CS+, as well as a gate terminal connected to the gate terminal of the first transistor M2 and to the first generator S0.

In the embodiment shown in FIG. 4A, MOS transistors M2, M3 and M4 are of the n-channel type.

It is also possible to realise the differential input stage T by using bipolar transistors, as shown in FIG. 4B.

In particular, the differential input stage T in the bipolar technology comprises a first T1 and a second bipolar transistor T2 inserted, in parallel to each other, between the first generator S0 and the terminal CS− and having the base terminals connected to each other and to a common circuit node XT.

The differential input stage T also comprises a third bipolar transistor T3 inserted between the second generator S1 and the terminal CS+ and having also the base terminal connected to the common circuit node XT.

Moreover, the differential input stage T in the bipolar technology comprises a symmetrisation block 12. In particular, this symmetrisation block 12 comprises the series of a bipolar transistor T4 and of a current generator G4, inserted between the supply voltage reference Vcc and the ground GND. The bipolar transistor T4 has a base terminal connected, by means of a current mirror comprising two MOS transistors M5, M1, to the emitter terminal of the third bipolar transistor T3.

Finally, this differential input stage T comprises a MOS transistor Mu connected to the supply voltage reference Vcc and having the gate terminal connected to the first generator S0, as well as a source terminal connected to the ground GND by means of a current generator Gu. Advantageously, the transistor Mu has also a body terminal connected to the terminal CS−.

In the embodiment of FIG. 4B, the MOS transistor Mu is of the n-channel type, while transistors M5 ed M6 are of the p-channel type and bipolar transistors T1, T2, T3 e T4 are of the npn type.

Advantageously according to the invention, the differential input stage T is equipped with a signal ENABLE through which all the input stage transistors are turned off, in the bipolar case by shortcircuiting the base terminals with the emitter terminals and in the MOS case by shortcircuiting the gate terminals with the source terminals.

In substance, the differential input stage T according to the invention aims at setting the voltage value below the first current generator S0. To this purpose, in the MOS embodiment, the drain and gate terminals of the MOS transistors M2 ed M3 are connected to each other and to the first generator S0. Moreover, the transistors comprised in the MOS embodiment of the differential input stage T are chosen in order to have a low impedance equal to 1/gm on the terminals CS+ and CS−. This feature is important since the terminals CS+ e CS− carry a stray capacity Cpar (sum of the capacities of the external connectors or leads and of the corresponding contact pads of the package comprising the final device) valuable in about 3 pF.

The reading circuit 1 has thus a pole due to the differential input stage T at a frequency fp1=gm/(2 pCpar), being gm the transconductance of the differential input stage T, equal to gm=2sqrt(25 uA×W/L×K).

Thus it results that, considering K=45 uA/V2 and W/L=400, gm=1300 uA/V and thus fp1=14 KHz.

Advantageously, in the bipolar embodiment, the transconductance gm is equal to 25 uA/25 mV=1000 uA/V. It results then that the pole fp1 is thus at a higher frequency than the pole introduced by the differential input stage T realised in the MOS technology.

In the bipolar technology differential input stage T, the compensation network 9, whose time constant is Rc×Cc, can thus be realised with a lower capacity value Cc, saving thus the silicon area.

It also happens that, for the same precision, the MOS embodiment of the differential input stage T must be much larger. In particular, in order to obtain a precision being equal to the bipolar embodiment (~1 mV), each MOS transistor comprised in the differential input stage T must have a side W=400 um with L=1 um, while each bipolar transistor has a size equal to 5 um×5 um. The bipolar embodiment will be then preferred in order to minimise the silicon area occupied by the differential input stage T.

The differential input stage T must also be symmetrical, i.e., that it must be crossed at the output by identical currents. In particular, a current difference on the terminals CS+ e CS− automatically becomes an error in the output signal Iout(t).

If the differential input stage T is realised by means of MOS transistors, this symmetry condition is obtained since the MOS transistor gate currents are null.

In a differential input stage T realised in the bipolar technology, the base current Ib of the bipolar transistors; T1 and T2 on one side and T3 on the other side, creates an asymmetry which must be compensated through the circuit block 12, shown in FIG. 4B.

In this case, the first current generator S0 is advantageously biased by means of the MOS transistor Mu. In order to maximise the voltage range on the terminals CS+ and CS−, the voltage drop on the gate terminal of the transistor Mu is made the lowest possible, by connecting the body terminal of this transistor Mu with the terminal CS−.

Advantageously, the differential input stage T can be used when the sense element is relating to the inductance or to the LowSide transistor ML, due to the large voltage dynamics being obtained on the terminals CS+ e CS−.

It is also possible to read a sense element relating to the HighSide transistor MH with a similar stage wherein the n-channel and p-channel MOS transistors and the npn and pnp bipolar transistors are swapped with each other.

Figure 5A:
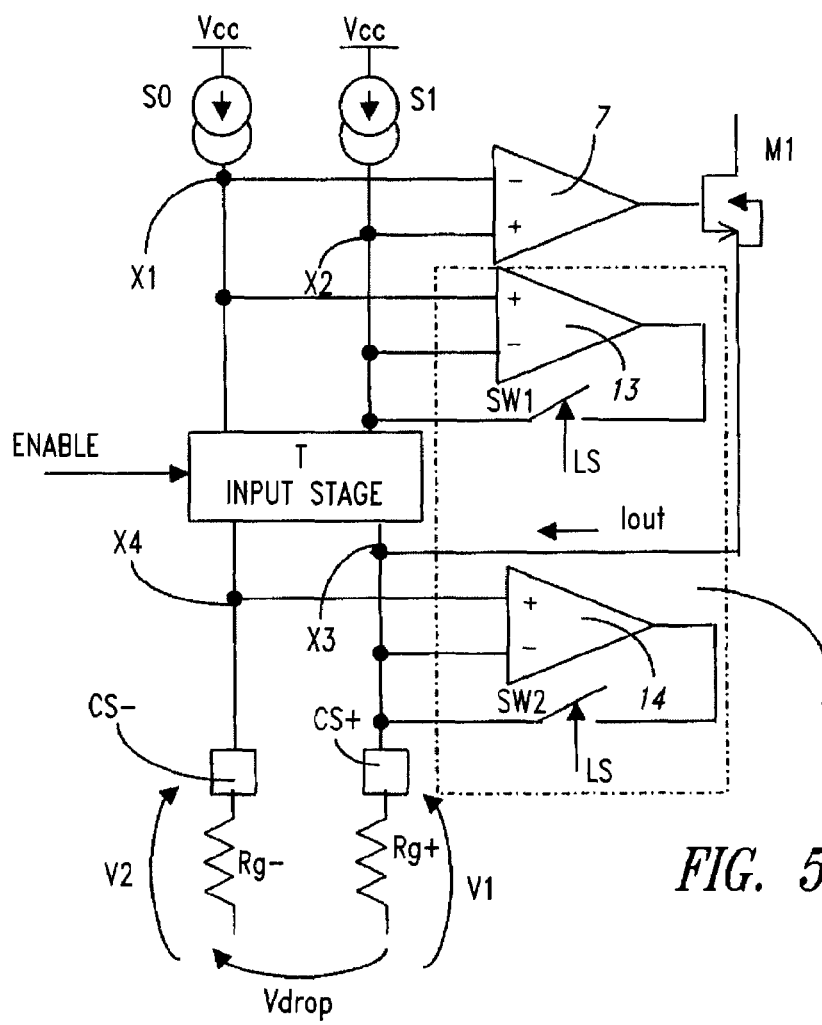
FIGS. 5A and 5B schematically show possible embodiments of a clamping circuit being comprised in the reading circuit of FIG. 1.
Figure 5B:
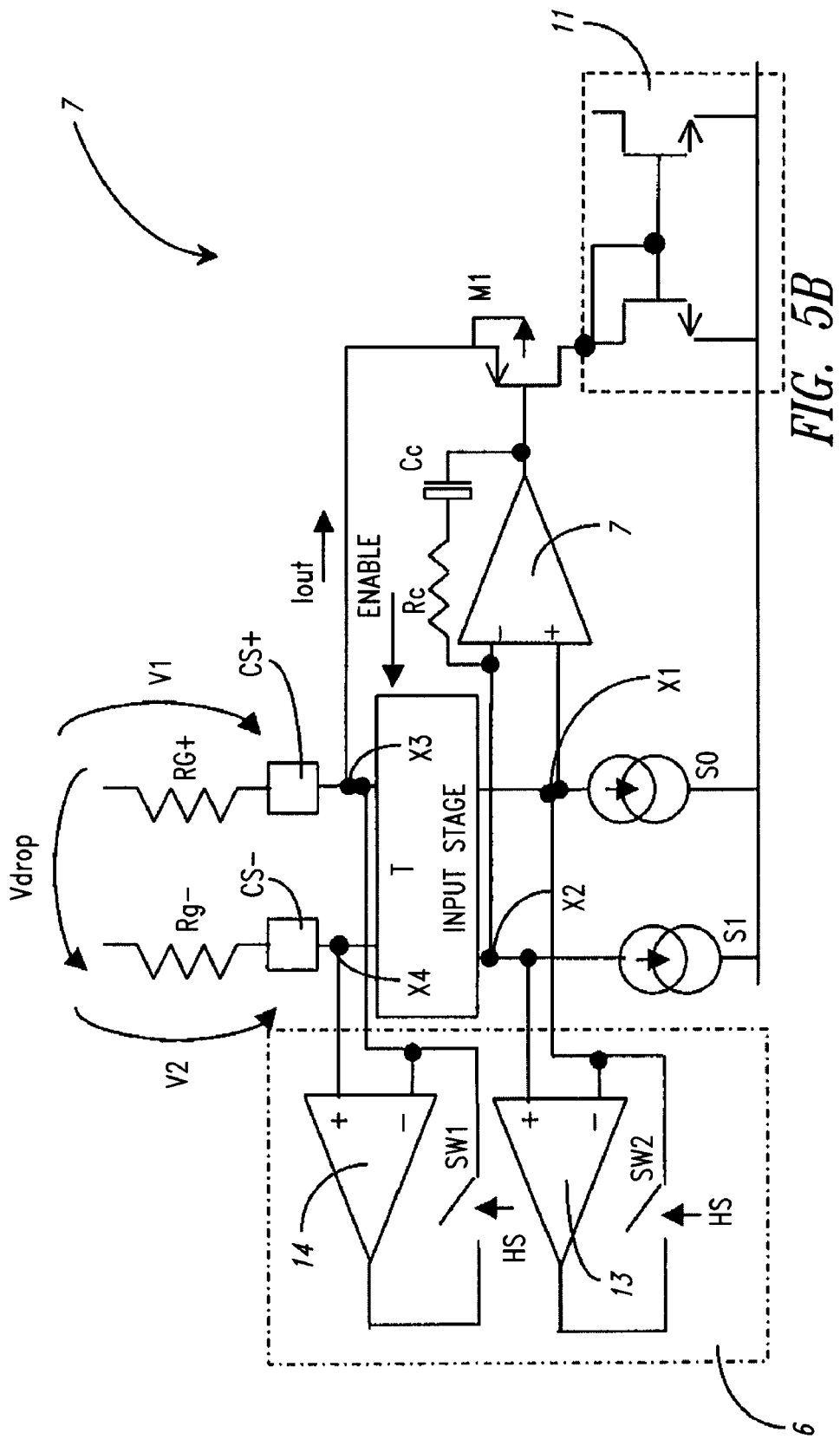

Advantageously, the reading circuit 1 comprises a clamping circuit 6, schematically shown in FIGS. 5A and 5B for the LowSide transistor ML and for the HighSide transistor MH respectively.

In particular, it is worth noting that the clamping circuit 6 is used to speed up the time required by the reading circuit 1 to recover the steady state, starting from an unsteady condition of the differential input stage T, of the bypass component M1 and of the differential stage 7. Thus, while it is preferred, it is not necessary in all embodiments. This is the case in which reading is performed on the LowSide transistor ML without using a sense resistance, but directly across the transistor ML.

In fact, when the LowSide transistor ML is on, it operates as a resistance and the reading circuit 1 can thus turn the voltage drop thereacross into the corresponding current signal. But when the LowSide transistor is off, the drain terminal thereof is brought to a high voltage value (even equal to 12V) by turning the HighSide transistor MH on. Under this condition, the signal Vdrop across the reading circuit 1 inverts the sign thereof with respect to the normal reading condition.

In particular, in the example being considered in the figure, while generally the signal Vdrop is about 100 mV at most, when the transistor MH turn on, the signal Vdrop is more than 10V. In this situation, the reading circuit 1 cannot operate and, although considering a broadband amplifier as comprised in the differential stage 7, i.e., with a high response speed, the reading circuit 1 would take much time to start operating even when the normal operating conditions have been recovered.

In order to speed up the response of the reading circuit 1 at the end of this unsteady condition, the clamping circuit 6 is used, which comprises a first 13 and second clamping block 14 connected across the differential input stage T.

These clamping blocks are thus used when the reading circuit 1 must turn the voltage signal Vdrop into current by means of the LowSide transistor ML and only when the LowSide transistor ML is off.

In particular, as shown in FIG. 5A, the first clamping block 13 is connected to the circuit nodes X1 and X2 and it is controlled by means of a first switch SW1 with a LowSide control LS=0 (corresponding to a turned-off condition of the LowSide transistor ML). Similarly, the second clamping block 14 is connected to the circuit node X3 and to a further circuit node X4 in correspondence with the terminal CS− and it is controlled by means of a second switch SW2 always with the LowSide control LS=0.

Therefore, the first clamping block 13 forces the circuit node X2 to reach the same voltage value of the circuit node X1 and the second clamping block 14 forces the circuit node X3 to reach the same voltage value of the circuit node X4.

When the reading circuit 1 uses the sense element associated to the HighSide transistor MH, it is possible to use a similar clamping circuit 6, comprising a first 13 and second clamping block 14, as schematically shown in FIG. 5B.

In particular, the first clamping block 13 is connected to the circuit nodes X1 e X2 and it is controlled by means of a first switch SW1 with a HighSide control HS=0 (corresponding to a turned-off condition of the HighSide transistor MH). Similarly, the second clamping block 14 is connected to the circuit nodes X3 and X4 and it is controlled by means of a second switch SW2 always with the HighSide control HS=0.

It is worth noting that when reading on the sense element associated to the inductance L it is not necessary to use any clamping circuit 6.

Advantageously, the clamping circuit 6 absorbs and deviates towards the ground terminal GND the high current on the terminal CS+, in order to set the terminal CS+ at the same voltage of the terminal CS−. In particular, considering the already shown example of Vdrop=−12V, this voltage Vdrop, applied to the resistance Rg+ of the terminal CS+ produces a current of several mA, equal to −Vdrop/Rg.

Figure 6A:
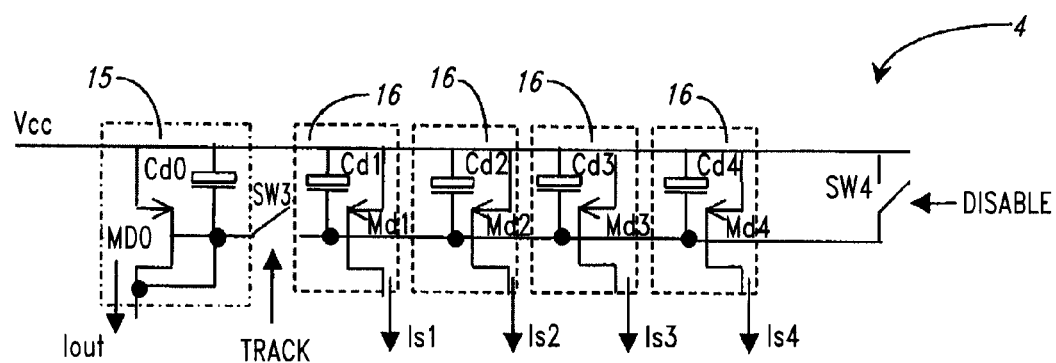
FIGS. 6A and 6B schematically show possible embodiments of a tracker being comprised in the reading circuit of FIG. 1.
Figure 6B:
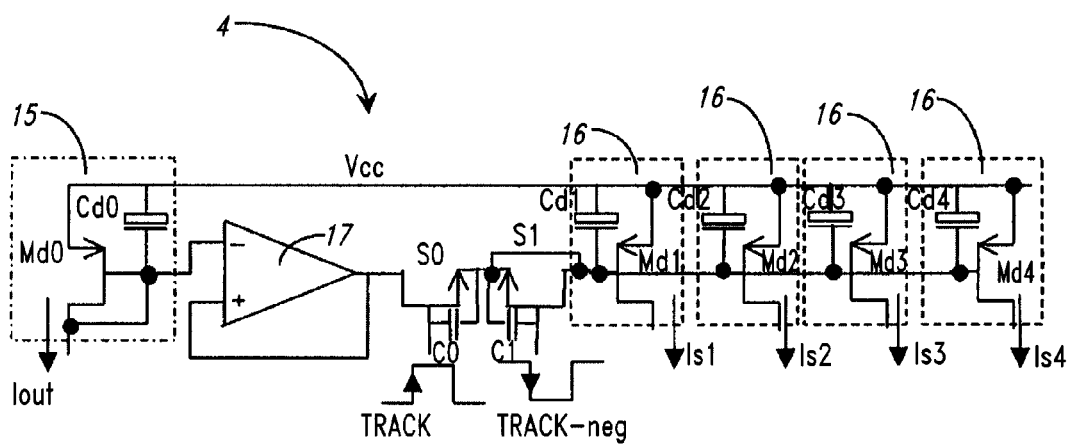

The reading circuit 1 according to the invention is also equipped with a tracker 4, schematically shown in FIGS. 6A and 6B.

In substance, the tracker 4 receives at the input a current value Iout coming from the reading circuit 1 and it outputs a tracked current value Is. Moreover, the tracker 4 receives a disabling signal DISABLE.

It is worth noting that the use of a tracker 4 is strongly preferred since., reading the sense element associated to the HighSide transistor MH or to the LowSide transistor ML, the current information Iout of the module being considered is available only when the sense element is really crossed by the current, while, out of this time interval, the clamping circuit 6 is activated.

Actually, even when the clamping circuit 6 is deactivated, the current information cannot be immediately acquired, since the reading circuit 1 requires anyhow a certain latency time (or settling time) before recovering from the clamping condition and thus providing a satisfactory output current information. The tracker 4 thus refreshes this information Iout only when it is sure for a time interval called TRACK period. For the remaining time period, called HOLD period, the tracker 4 keeps outputting a current value Is corresponding to the last valid value of the information Iout.

It is worth noting that when the reading circuit 1 uses as sense element the inductance of the DC-DC converter modules, it is no more necessary to distinguish between TRACK period and HOLD period since the information Iout is always valid and the clamping circuit 6 is not used.

In particular, as schematically shown in FIG. 6A, the tracker 4 comprises an input block 15 and a plurality of elements 16, in parallel to each other, fed by the supply voltage reference Vcc at 5 V.

The input block 15 comprises a MOS transistor Md0, having a first conduction terminal, particularly a source terminal connected to the supply voltage reference Vcc and a second conduction terminal, particularly a drain terminal connected to the gate terminal and effective to provide the information given by the output current Iout. The transistor Md0 has an intrinsic capacity Cd0 between the source terminal and the gate terminal.

The input block 15 is thus connected, by means of a first switch SW3 to the plurality of elements 16, each comprising in turn a MOS transistor Md1, Md2, Md3, Md4 fed by the supply voltage reference Vcc and having each an intrinsic capacity Cd1, Cd2, Cd3, Cd4 between the source terminal and the gate terminal. These elements 16 repeat a current being proportional to a voltage drop comprised between the source and gate terminals of the transistors Md1, Md2, Md3, Md4. The first switch SW3 is controlled by a signal TRACK, particularly a digital signal.

The transistors Md1, Md2, Md3, Md4 of the elements 16 have a first conduction terminal, particularly a source terminal connected to the supply voltage reference Vcc and a second conduction terminal, particularly a drain terminal effective to provide a plurality of currents Is1, Is2, Is3 ed Is4, respectively.

The transistors Md1, Md2, Md3, Md4 of the elements 16 have also all the gate terminals connected to each other and to the first switch SW3.

Finally, the tracker 4 comprises a second enabling switch SW4 inserted between the supply voltage reference Vcc and the common gate terminals of the transistors Md1, Md2, Md3, Md4 of the elements 16 and driven by a signal DIS-ABLE. In particular, by means of this second switch SW3 and the signal DISABLE it is possible to cancel the output currents Is1, Is2, Is3, Is4 of the transistors Md1, Md2, Md3, Md4 of the elements 16.

It is worth noting that the just described tracker 4 car be used by the reading circuit 1 when the reading uses a sense element associated to the LowSide transistor ML.

In this case, the output current information Iout is turned into a voltage by means of the transistor MD0 of the diode-configured input block 15 and it is repeated on the transistors Md1, Md2, Md3, Md4 of the elements 16 when the first switch SW3 is closed by the signal TRACK.

On the contrary, when the first switch SW3 is kept open by means of the signal TRACK, then the current values Is1, Is2, Is3, Is4 outputted from the elements 16 hold a value corresponding to the last tracked current value of the information Iout since the intrinsic capacities Cd1, Cd2, Cd3, Cd4 of the transistors Md1, Md2, Md3, Md4 of the elements 16 store the gate-source voltage value of these transistors.

Actually, in the practical implementation of the tracker 4, is preferred to take into consideration the fact that the first switch SW3 is usually implemented through a MOS transistor and it has its own intrinsic capacity between the gate and source terminals, which changes the real behaviour of the tracker 4.

In particular, the signal TRACK injects a parasitic charge on the intrinsic capacities Cd1, Cd2, Cd3, Cd4 of the transistors Md1, Md2, Md3, Md4 and this changes the value of the tracked signal composed by the currents Is1, Is2, Is3, Is4.

In order to cancel this noise the first switch SW3 of the tracker 4 is thus advantageously realised by means of a first SW4 and second MOS transistor SW6, as schematically shown in FIG. 6B. In particular, the second transistor SW6 has the drain terminal and the source terminal connected to each other and it serves to absorb a spurious charge value injected by the signal TRACK on the gate terminal of the first transistor SW5. The first transistor SW5 is thus the real tracking switch.

In order to obtain such a function of the second transistor SW6, the gate terminal thereof is driven by the negative signal TRACK.

Moreover, it must be taken into consideration that the tracker 4 realises four copies of the output current signal Is1, Is2, Is3, Is4 with a total capacity being used to store this datum corresponding to four times the value Cd of the intrinsic capacities Cd1, Cd2, Cd3, Cd4; while the transistor Md0 of the input block 15 has a single intrinsic capacity Cd0. Therefore, when the first switch SW5 is closed, an unpleasant "charge sharing" effect occurs, which changes the tracked signal and which lasts about 3×RSW5×4Cd, being RSW5 the resistance value of this first switch SW5.

In a real example, this charge sharing time is equal to 10 Kohm×2 pF=30 ns.

In this case, if the tracking time lasts for about tens of ns, there is the risk to hold in the HOLD period a wrong signal, particularly not yet set.

It is also possible to halve the charge sharing effect by increasing the area occupied by the transistor Md0 of the input block 15: i.e., by adding three further copies of this transistor Md0 with the source terminals connected to the supply voltage reference, the gate terminals connected to each other and the drain terminals being not connected.

Advantageously, the tracker 4 thus comprises an amplifier 17 inserted between the input block 15 and the connection switches SW5, SW6 to the elements 16 in order to uncouple the components realising the tracked signal from the component to be tracked.

In one embodiment of the tracker 4 according to the invention, the specifications of this amplifier 17 are the following:
  the lowest offset value between the input terminals thereof, since this offset value automatically results in an error in the currents Is1, Is2, Is3, Is4 outputted from the elements 16;
  1/GBWP<30 ns, i.e., a GBWP value [where GBWP indicates the Gain Bandwidth product] of about 10 MHz in order to control the tracked signal when the switches SW5 and SW6 are closed.

Advantageously, the reading circuit 1 also comprises a detector 5 used to distinguish the reading conditions on sense elements associated to the inductance, to the LowSide transistor ML and to the HighSide transistor MH.

Advantageously, this detector 5 determines the reading type by measuring a common mode voltage of the terminals CS+ and CS− when a current source circuit effective to measure the information given by the output current Iout is operating (i.e., when the clamping circuit 6 is deactivated).

However it is not possible to directly measure a voltage on these terminals CS+ and CS− since the stray capacity value on the terminal CS+ makes it difficult for the current sense circuit to reach a stable condition. It is however equivalent to measure the voltage on the terminal CS− which does not conversely insert any defect in the current sense circuit.

Taking into consideration a real case with Vin ATX5V or ATX12V and Vout=0.8-1.6V, the following three case are obtained:

1. Reading of a sense element relating to the HighSide transistor MH:
   CS−=Vin−50 uA×Rg where Rg=Vdropmax/35 uA=Rsense×Imax/35 uA and Vin bus ATX 5V
   CS−>4.5V−52.5 uA×Rsense×Imax/35 uA because of the statistical variation of the bias current by 50 uA.

Given that the highest current for the modules of an interleaved DC-DC converter is nowadays set at 35 A and the highest Rsense value for a reading connected to the HighSide transistor MH is equal to 10 mOhm, it results:
   CS−>4.5V−52.5 uA×10 mOhm×35 A/35 uA=3.95V 2. Reading of a sense element relating to the LowSide transistor ML:
   CS−=50 uA×Rg where Rg=Vdropmax/35 uA=Rsense×Imax/35 uA
   CS−<52.5 uA×Rsense×Imax/35 uA because of the statistical variation of the bias current by 50 uA.

Given that the highest current for the modules of an interleaved DC-DC converter is nowadays set at 35 A and the highest Rsense value for a reading connected to the LowSide transistor ML is equal to 10 mOhm, it results:
   CS−<0.55V 3. Reading of a sense element relating to the inductance:
   CS−=Vout+Rsense×I+50 uA×Rg where Vout is the interleaved DC-DC converter output voltage value, I is the average current value of the inductance.

Moreover, by considering the relationship of the voltage positioning generally realised in the CPU regulators, it also results that:
   Vout=VID+DVID−Rdroop×I where VID is the nominal voltage value (between 0.8V and 1.6V) for I=0 of the CPU, 25 mV is the highest accepted variation DVID and Rdroop is the converter output impedance value.

Then it results:
   CS−=VID×25 mV−Rdroop×I+Rsense×I+50 uA×Rsense×Imax/35 uA

The lowest voltage value at the terminal CS− is then:
   CS−>0.8−0.025V+(Rsense−Rdroop)×I+55 uA×Rsense×Imax/35 uA In particular, the minimum value is obtained for I=0.

Being the Rsense value certainly higher than 1 mOhm for the inductance and the highest module current Imax at least equal to 15 A per phase, it results:
   CS−>0.8−0.025V+0.025V=0.8V It is worth noting that the highest voltage value on the terminal CS− is connected to the highest value VID, equal in the considered example to 1.6V. This highest value is however well far from the limit represented by the reading of the sense element associated to the HighSide transistor MH (3.95V) and it is thus possible to arbitrarily consider a value equal to 3V.

The voltage value on the terminal CS− thus allows the reading mode performed by the reading circuit 1 to be distinguished. In particular:
   a. CS−<0.55V: reading on a LowSide sense element
   b. 0.8V<CS−<3V: reading on the inductance
   c. CS−>3.95V: reading on a HighSide sense element (Vin ATX 5V)

Advantageously, the detector 5 thus comprises two comparators with thresholds being equal to 0.7V and 3.5V in order to distinguish the reading mode being used.

In particular, the detector 5, according to the so-determined reading type, enables/disables the differential input stages T of the current source 3 and the related trackers 4.

Due to the high voltage range on the terminals CS− e CS+ which is obtained with the current source 3 having a differential input stage T realised through bipolar transistors, it is thus possible to use only two reading circuits, particularly connected to the HighSide transistor MH and to the LowSide transistor ML, since when reading on the inductance it is sufficient not to use both the tracker 4, holding the switch SW5 closed, and the clamping circuit 6.

Figure 7:
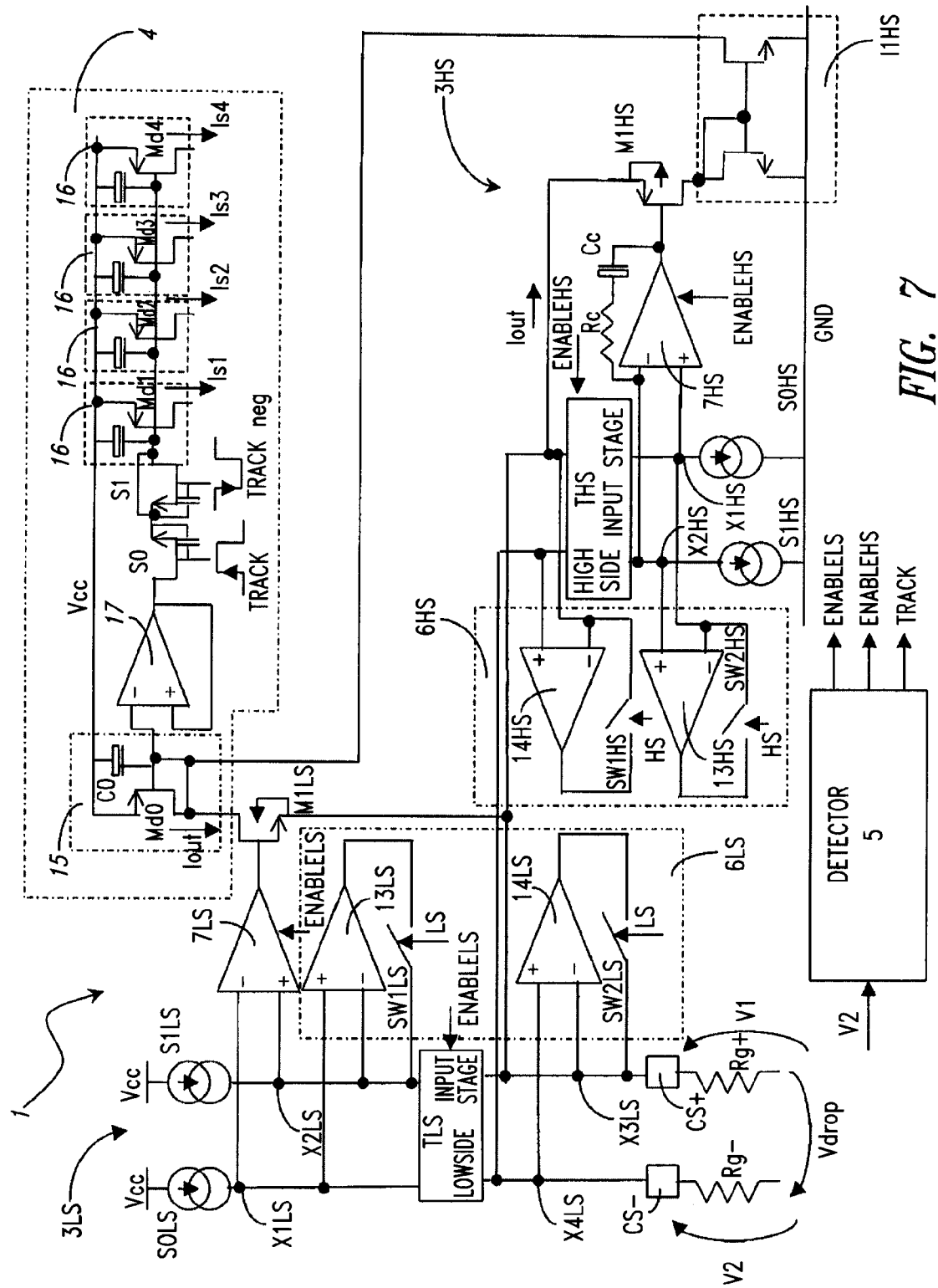
FIG. 7 shows a possible implementation of the reading circuit of FIG. 1.

The multisense-adaptive reading circuit 1 as schematically shown in FIG. 7 is thus obtained.

The reading circuit 1 comprises a first current source 3LS associated to the sense element of the LowSide transistor M1 of the DC-DC converter module whereon the reading circuit 1 operates. The letters LS have been added to the elements comprised in the current source 3LS, corresponding to the topology being already described with reference to FIG. 5A in order to indicate the association with the LowSide transistor ML.

Moreover, the reading circuit 1 also comprises a second current source 3HS associated to the sense element of the HighSide transistor MH. Similarly, the letters HS have been added to the elements comprised in the current source 3HS, corresponding to the topology being already described with reference to FIG. 5B in order to indicate the association with the HighSide transistor MH.

The reading circuit 1 thus comprises a tracker 4 connected to the bypass component M1LS of the current source 3LS associated to the LowSide transistor ML as well as to the current mirror stage 11, connected in turn between the bypass component M1HS of the current source 3HS associated to the HighSide transistor MH.

Finally the reading circuit 1 comprises a detector 5 receiving at the input the voltage signal V2 of the terminal CS− and outputting the enabling signals ENABLELS and ENABLEHS of the differential stages, 7LS and 7HS, respectively comprised in the current sources, 3LS and 3HS, associated to the LowSide ML and HighSide MH transistors.

The detector 5 also outputs the enabling signal TRACK of the switches SW5 and SW6 comprised in the tracker 4.

Figure 8:
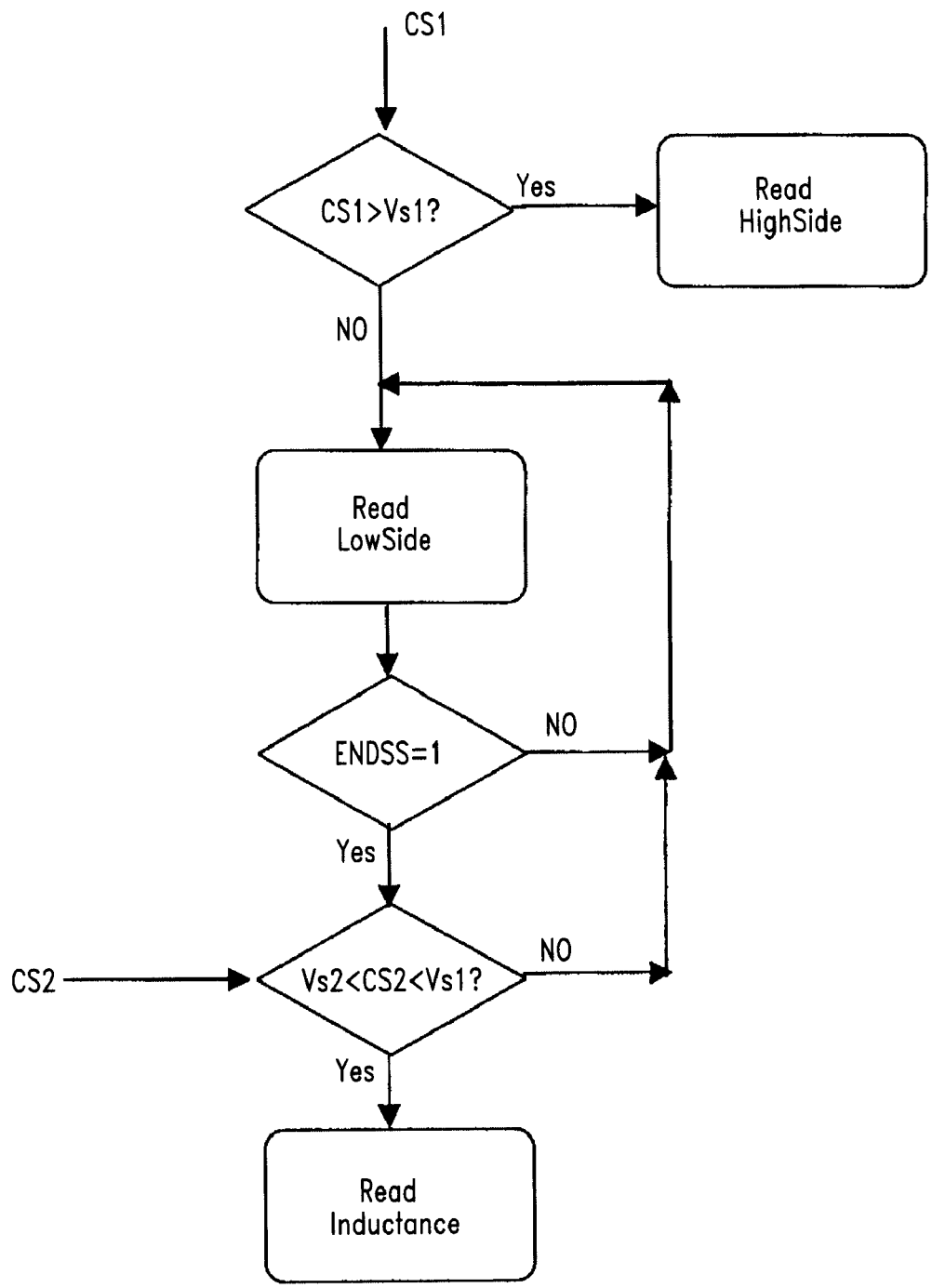
FIG. 8 is a flowchart representing the multisense-self-adaptive reading method according to the invention.

Advantageously, the reading circuit 1 implements the reading multisense-self-adaptive method according to the invention, whose steps are schematically shown through the flow-chart of FIG. 8.

In particular, just fed, the reading circuit 1 performs a measuring CS1 of the voltage V2 on the terminal CS−, which is considered a common mode voltage based on the above-described considerations, and it performs the following steps:

a. if the measured voltage CS1 is higher than a first threshold value Vs1, a first HighSide reading mode is selected; and b. if the measured voltage CS1 is lower than a first threshold value Vs1, a second LowSide reading mode is selected. In particular the tracker 4 and the clamping circuit 6 are activated.

The second LowSide reading mode thus continues until the output voltage reaches a steady value. At this point, the reading circuit 1 ends a so-called SoftStart step and the method according to the invention provides the following further steps:

c. a generation step of a control signal ENDSS of the end of the SoftStart step with the assignment ENDSS=1;

d. a new measuring step of the value CS2 of the voltage V2 of the terminal CS− based whereon the method continues with the following steps:

d1. If CS2 is comprised between a second threshold value Vs2 and the first threshold value Vs1, with Vs2>Vs1, a third inductance reading mode is selected, disabling the clamping circuit 6 and the tracker 4 (always holding the switch SW5 closed);

d2. Otherwise the second LowSide reading mode is kept.

In particular, the above-mentioned selection steps correspond to the assignment of convenient values to the enabling signals ENABLELS and ENABLEHS, as well as to the signal TRACK. In particular:

a. the first selection step (corresponding to the HighSide reading) assigns the following values:
ENABLELS=0
ENABLEHS=1 and
TRACK=TRACKHS b. the second selection step (corresponding to the LowSide reading) assigns the following values:
ENABLELS=1
ENABLEHS=0 and
TRACK=TRACKLS c. the third selection step (corresponding to the inductance reading) assigns the following values:
ENABLELS=1
ENABLEHS=0
TRACK=1

In the embodiment of the previously shown current sources 3LS e 3HS, it results that:
Vs1=0.8V and
Vs2=3.5V In substance, the reading circuit 1 according to the invention is capable to automatically adapt to the component being used as a sense element, thus allowing the design of the interleaved DC-DC converter associated thereto to be freely optimised, without jeopardising the required features of precision, speed and noise-freedom.

In fact, it can be immediately noticed that the reading circuit 1 realised according tot he invention complies with the technical specifications required by the interleaved DC-DC converter applications and particularly:

absolute precision on Iout(t) for Iout(t)=50 uA: Pa<+/−5%
absolute precision on Iout(t) for Iout(t)=25 uA: Pol<+/−5%
relative precision between Iout(t) step i and Iout(t) step j:
Pij<+/−1-2% pre-tracking settling time: Ts<150 ns
lowest tracking time: Tc<200 ns
highest range of the signal Vdrop(t): −25 uA×Rg<Vdrop(t)<35 uA×Rg
highest voltage at the terminals CS+ and CS−: 5V In conclusion, the reading circuit 1 is a bidirectional differential transconductance system capable to adapt to the reading mode between the LowSide, HighSide and inductance reading, as well as a linear programmable-gain system (equal to 1/Rg) with high common mode dynamics. Moreover, by using a differential input stage T realised in the bipolar technology it is possible to maximise the speed and precision, meanwhile minimising the area required for the integration thereof.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A multisense-adaptive reading circuit associated to a sense module, the reading circuit comprising:
at least a first and a second current source coupled to a first and a second terminal of said module, said first and second terminals being coupled respectively to a first and a second resistive element;
a tracker to track current information output from said first and second current sources;
a reading mode detector to detect a common mode voltage value and based on said value, to determine a reading mode being used among possible reading modes to self-adapt said reading circuit to said reading mode being used, by providing enabling signals to said first and second current sources and to said tracker, wherein:
said reading mode detector includes a first and a second comparator with a first and a second threshold respectively, said second threshold being lower than said first threshold in order to determine said reading mode being used starting from said detected value of said common mode voltage according to conditions:
a. CS−<Vs2: first reading mode on a sense element associated to a low side transistor of said module;
b. Vs2<CS−<Vs1: second reading mode on an inductance of said module; and
c. Cs−>Vs1: third reading mode on a sense element associated to a high side transistor of said module,
wherein CS− is said common mode voltage value, Vs1 is said first threshold, and Vs2 is said second threshold.

2. The reading circuit of claim 1, further including:
an interleaved DC-DC converter within the sense module.

3. A reading circuit according to claim 1 wherein said first current source is used when reading said sense element associated to said low side transistor of said module and said second current source is used when reading said sense element associated to said high side transistor of said module.

4. A reading circuit according to claim 1, further comprising at least a first and a second clamping circuit coupled to said first and second current source respectively.

5. A reading circuit according to claim 1 wherein said common mode voltage value is detected in correspondence with said second terminal.

6. A reading circuit according to claim 1 wherein said first and second resistive elements have a resistance value being set in order to determine a highest current of said module.

7. A multisense-adaptive reading circuit associated to a sense module, the reading circuit comprising:
- at least a first and a second current source coupled to a first and a second terminal of said module, said first and second terminals being coupled respectively to a first and a second resistive element;
- a tracker to track current information output from said first and second current sources; and
- a reading mode detector to detect a common mode voltage value and based on said value, to determine a reading mode being used among possible reading modes to self-adapt said reading circuit to said reading mode being used, by providing enabling signals to said first and second current sources and to said tracker,
- wherein said first and second current sources include at least a differential input stage coupled to said terminals, said first and second current sources being coupled to a voltage reference by a first and a second current generator;
- wherein said first and second current sources further include at least a differential stage being input-connected to said first and second current generators in correspondence with a first and second circuit node and output-connected to a bypass component, coupled in turn to an intermediate circuit node between said differential input stage and said first terminal, and
- wherein said differential input stage, said differential stage and said bypass component realize a negative feedback loop to force said first terminal to set at a same voltage set on said second terminal.

8. A multisense-adaptive reading circuit associated to a sense module, the reading circuit comprising:
- at least a first and a second current source coupled to a first and a second terminal of said module, said first and second terminals being coupled respectively to a first and a second resistive element;
- a tracker to track current information output from said first and second current sources; and
- a reading mode detector to detect a common mode voltage value and based on said value, to determine a reading mode being used among possible reading modes to self-adapt said reading circuit to said reading mode being used, by providing enabling signals to said first and second current sources and to said tracker,
- wherein said first and second current sources include at least a differential input stage coupled to said terminals, said first and second current sources being coupled to a voltage reference by a first and a second current generator, and
- wherein said second current source further includes a balancing network, said balancing network having a resistive element and a capacitor coupled in series and coupled between an output terminal and an input terminal of a differential stage.

9. A multisense-adaptive reading circuit associated to a sense module, the reading circuit comprising:
- at least a first and a second current source coupled to a first and a second terminal of said module, said first and second terminals being coupled respectively to a first and a second resistive element;
- a tracker to track current information output from said first and second current sources; and
- a reading mode detector to detect a common mode voltage value and based on said value, to determine a reading mode being used among possible reading modes to self-adapt said reading circuit to said reading mode being used, by providing enabling signals to said first and second current sources and to said tracker,
- wherein said first and second current sources include at least a differential input stage coupled to said terminals, said first and second current sources being coupled to a voltage reference by a first and a second current generator, and
- wherein said second current source further includes a current mirror stage coupled between a bypass component and said voltage reference.

10. A reading circuit according to claim 9 wherein said differential input stage is realized in MOS technology by:
- a first and a second MOS transistor, inserted in parallel to each other between said first generator and said second terminal and having drain and gate terminals coupled to each other and to said first generator, and having source terminals coupled to each other and to said second terminal; and
- a third MOS transistor having conduction terminals coupled between said second generator and said first terminal, and having a gate terminal coupled to said gate terminal of said first MOS transistor and to said first generator.

11. A reading circuit according to claim 10 wherein said first, second and third MOS transistors are chosen in order to have a low impedance on said first and second terminals.

12. A reading circuit according to claim 8 wherein said differential input stage is realized in bipolar technology by:
- a first and a second bipolar transistor inserted, in parallel to each other, between said first generator and said second terminal and having respective base terminals coupled to each other and to a common circuit nodes; and
- a third bipolar transistor inserted between said second generator and said first terminal and having also a base terminal coupled to said common circuit node.

13. A reading circuit according to claim 12 wherein said differential input stage in the bipolar technology further includes a symmetrization block having in turn fourth bipolar transistor and a current generator coupled in series, inserted between a first and a second voltage reference, said forth bipolar transistor having a base terminal coupled, by a current mirror, to an emitter terminal of said third bipolar transistor.

14. A reading circuit according to claim 13 wherein said differential input stage in the bipolar technology further includes a MOS transistor coupled to said first voltage reference and having a gate terminal connected to said first generator, a source terminal coupled to said second voltage reference by a current generator and a body terminal coupled to said second terminal.

15. A reading circuit according to claim 7 wherein said differential input stage receives an enabling signal through which all transistors included in said differential input stage therein are turned off.

16. A reading circuit according to claim 4 wherein said first and second clamping circuits include respective first and second clamping blocks coupled across differential input stage by switches driven by an enabling signal corresponding to conditions:
- LS=0 turned-off said low side transistor, and
- HS=0 turned-off said high side transistor,
- wherein LS is a turn-on command of said low side transistor and HS is a turn-on command of said high side transistor.

17. A reading circuit according to claim 1 wherein said tracker receives at its input a current value coming from bypass elements of said first and second current sources and said tracker outputs a tracked current value and said tracker is enabled by an enabling signal.

18. A reading circuit according to claim 17 wherein said tracker refreshes said current value only when this value is sure for a first time interval and said tracker keeps outputting a tracked current value corresponding to a last valid value of said current value for a second time period.

19. A reading circuit according to claim 7 wherein said tracker includes an input block coupled, by at least a switch block controlled by driving signals, to a plurality of elements, arranged in parallel to each other and fed by said voltage reference.

20. A reading circuit according to claim 19 wherein said input block includes a transistor, having a first conduction terminal coupled to said voltage reference and a second conduction terminal coupled to a control terminal and effective to provide an information given by an output current, said transistor having an intrinsic capacity between the first conduction terminal and said control terminal.

21. A reading circuit according to claim 19 wherein said elements include each at least a transistor coupled to said voltage reference and having an intrinsic capacity between a conduction terminal connected to said voltage reference and a control terminal, said transistors having a further drain terminal effective to provide a plurality of currents, as well as respective control terminals being coupled to each other and to said switch block.

22. A reading circuit according to claim 19 wherein said switch block includes a first and second switch to receive a driving signal and a negative thereof respectively, said second switch having conduction terminals coupled to each other and, when said second switch is closed by said negative driving signal, said second switch is adapted to absorb a spurious charge value injected by said driving signal on a control terminal of said first switch which is adapted to serve as a tracking switch and, when said first switch is closed by the driving signal, said first switch enables said elements to repeat an output current value being turned into a voltage by said input block, while, when said first switch is kept open by said driving signal, said elements provide a plurality of currents with a value corresponding to a last tracked current value of said output current being stored by intrinsic capacities of transistors of said elements.

23. A reading circuit according to claim 19 wherein said tracker further includes an amplifier inserted between said input block and said switch block coupled to said elements.

24. A reading circuit according to claim 20 wherein said input block includes further transistors, having first conduction terminals coupled to said voltage reference and control terminals coupled to each other, as well as second unconnected conduction terminals.

25. A multisense-self-adaptive reading method of a current value flowing in a sense module, the reading method comprising:
  detecting a first value of a common mode voltage;
  comparing said detected first value with a first threshold value;
  if said detected first value is higher than said first threshold value, selecting a first reading mode;
  if said detected first value is lower than said first threshold value, selecting a second reading mode, wherein said second reading mode is carried on until an output voltage reaches a steady value corresponding to an end of a soft start;
  generating a control signal at the end of said soft start;
  measuring a second value of said common mode voltage; and
  comparing between said second value and said first threshold value and a second threshold value, said second threshold value being higher than said first threshold value.

26. A reading method according to claim 25, further comprising:
  if said second value is between said second threshold value and said first threshold value, selecting a third reading mode; and
  otherwise keeping said second reading mode.

27. A reading method according to claim 25 wherein said selecting said reading modes selection correspond to assigning values to a plurality of enabling signals.

* * * * *

UNITED STATES PATENT AND TRADEMARK OFFICE
CERTIFICATE OF CORRECTION

PATENT NO. : 7,411,428 B2
APPLICATION NO. : 10/897326
DATED : August 12, 2008
INVENTOR(S) : Alessandro Zafarana It is certified that error appears in the above-identified patent and that said Letters Patent is hereby corrected as shown below:

Column 18
Line 34, "each other and to a common circuit nodes; and" should read as -- each other and to a common circuit node; and --

Column 18
Line 40, "includes a symmetrization block having in turn fourth bipolar" should read as -- includes a symmetrization block having in turn a fourth bipolar --

Column 18
Line 58, "second clamping blocks coupled across differential input stage" should read as -- second clamping blocks coupled across a differential input stage --

Column 20
Line 39, "selecting said reading modes selection correspond to assigning" should read as -- selecting said reading modes corresponds to assigning --

Signed and Sealed this

Twenty-eighth Day of April, 2009

JOHN DOLL
*Acting Director of the United States Patent and Trademark Office*